(12) United States Patent
Chu

(10) Patent No.: US 9,348,692 B2
(45) Date of Patent: May 24, 2016

(54) FLASH MEMORY APPARATUS, MEMORY CONTROLLER AND METHOD FOR CONTROLLING FLASH MEMORY

(71) Applicant: Asolid Technology Co., Ltd., Hsinchu (TW)

(72) Inventor: Chia-Ching Chu, Taichung (TW)

(73) Assignee: Asolid Technology Co., Ltd., Hsinchu (TW)

(*) Notice: Subject to any disclaimer, the term of this patent is extended or adjusted under 35 U.S.C. 154(b) by 204 days.

(21) Appl. No.: 14/054,844

(22) Filed: Oct. 16, 2013

(65) Prior Publication Data

US 2015/0006999 A1 Jan. 1, 2015

(30) Foreign Application Priority Data

Jul. 1, 2013 (TW) .............................. 102123536 A

(51) Int. Cl.

| G11C 29/04 | (2006.01) |
|---|---|
| G11C 29/42 | (2006.01) |
| G11C 29/44 | (2006.01) |
| G06F 11/10 | (2006.01) |
| G11C 29/00 | (2006.01) |
| G11C 16/34 | (2006.01) |

(52) U.S. Cl.
CPC ............ *G06F 11/1048* (2013.01); *G11C 29/42* (2013.01); *G11C 29/44* (2013.01); *G11C 29/822* (2013.01); *G11C 16/349* (2013.01); *G11C 2029/0411* (2013.01); *G11C 2029/4402* (2013.01)

(58) Field of Classification Search
CPC ....... G06F 17/00; G06F 3/0601; G06F 3/061; G06F 3/0673; G06F 12/0246; G06F 11/1068; G06F 11/048; G11C 11/409; G11C 7/1039; G11C 2029/4402; G11C 29/42; G11C 29/44; G11C 29/04

USPC ........................... 714/6.1, 773, 795, 799, 746
See application file for complete search history.

(56) References Cited

U.S. PATENT DOCUMENTS

| 7,751,238 | B2 | 7/2010 | Seol | |
| 7,752,526 | B2* | 7/2010 | Shiota ................. | G06F 11/1044 365/185.33 |
| 8,750,042 | B2* | 6/2014 | Sharon et al. ............ | 365/185.09 |
| 8,996,958 | B2* | 3/2015 | Cideciyan et al. ............ | 714/773 |
| 2004/0022149 | A1* | 2/2004 | Hu .......................... | G11B 20/18 369/47.22 |
| 2006/0013095 | A1* | 1/2006 | Liu ..................... | G11B 7/00375 369/53.15 |
| 2009/0282301 | A1 | 11/2009 | Flynn et al. | |
| 2012/0017071 | A1 | 1/2012 | Shahar et al. | |
| 2014/0351673 | A1* | 11/2014 | Ware et al. ..................... | 714/764 |

OTHER PUBLICATIONS

"Office Action of Taiwan Counterpart Application", issued on May 27, 2015, p. 1-p. 6, No English translation.

* cited by examiner

*Primary Examiner* — Phung M Chung
(74) *Attorney, Agent, or Firm* — Jianq Chyun IP Office

(57) ABSTRACT

A memory controller includes a damaged-column manager, an error checking and correcting decoder (ECC decoder) and a damaged-column decision circuit. The damaged-column manager logs a damaged-column address information in the flash memory. The ECC decoder receives a read data read by the flash memory and generates an error information according to whether or not the read data has error. The damaged-column decision circuit receives the error-column address and counts the number of accumulated generated times corresponding to the error-column address. The damaged-column decision circuit updates the damaged-column address information according to an error information.

18 Claims, 3 Drawing Sheets

FLASH MEMORY APPARATUS, MEMORY CONTROLLER AND METHOD FOR CONTROLLING FLASH MEMORY

CROSS-REFERENCE TO RELATED APPLICATION

This application claims the priority benefit of Taiwan application serial no. 102123536, filed on Jul. 1, 2013. The entirety of the above-mentioned patent application is hereby incorporated by reference herein and made a part of this specification.

BACKGROUND OF THE INVENTION

1. Field of the Invention

The invention generally relates to a flash memory apparatus, and more particularly, to a method for managing the damaged-column address information of a flash memory.

2. Description of Related Art

With the advances in electronic technology, electronic devices have become an essential tool in people's lives. In order to provide a huge data storage space in an electronic device, the flash memory has played a major role for the field of the storage apparatuses in today's electronic devices.

In a flash memory, some of the memory cells for column addresses have failed to normally perform read/write operations even at the factory's shipping stage. The information of these damaged-column addresses are, in predetermination, stored in a damaged-column manager in a memory controller which the flash memory belongs to. The memory controller then selects some appropriate memory cells for reserved column addresses in the flash memory so as to replace the memory cells with damaged-column addresses. However, in the prior art, the damaged-column address information stored in the damaged-column manager is obtained through a testing on the flash memory before shipping out the good from the factory, which means the damaged-column address information obtained against a single flash memory is fixed and unchanged. Once the flash memory generates a new damaged-column during the use, the above-mentioned damaged-column manager is unable to know these newly-occurred damaged-column addresses. In other words, the damaged-column manager is unable to prevent the accessing operation on the newly-occurred damaged-columns which may make the data lost.

SUMMARY OF THE INVENTION

Accordingly, the invention is directed to a memory controller able to dynamically detect the error column addresses in a flash memory and update the damaged-column address information.

The invention provides a memory controller configured to control a flash memory. The memory controller includes a damaged-column manager, an error checking and correcting decoder (ECC decoder) and a damaged-column decision circuit. The damaged-column manager logs a damaged-column address information in the flash memory. The ECC decoder receives a read data read by the flash memory, performs decoding on the read data and generates an error information according to the read data. The damaged-column decision circuit is coupled to the ECC decoder and coupled to the damaged-column manager, in which the damaged-column decision circuit receives the error information and updates the damaged-column address information according to the error information.

In an embodiment of the invention, the ECC decoder judges whether or not the read data has error and outputs an error-column address corresponding to the read data with generated errors to serve as the error information.

In an embodiment of the invention, the damaged-column decision circuit counts a number of accumulated generated times of the error-column address and delivers the error-column address to the damaged-column manager according to the number of accumulated generated times.

In an embodiment of the invention, the damaged-column manager stores the error-column address so as to update the error-column address information.

In an embodiment of the invention, when the number of accumulated generated times of the error-column address is greater than a predetermined threshold, the damaged-column decision circuit delivers the error-column address to the damaged-column manager.

In an embodiment of the invention, the damaged-column decision circuit includes a plurality of buffers, which are sequentially coupled in series between the ECC decoder and the damaged-column manager, in which an i-th-stage buffer stores the error-column address with a number of accumulated generated times equal to i and i herein is a positive integer.

In an embodiment of the invention, the memory controller further includes an ECC encoder, a scrambler, a writing circuit, a reading circuit and an descrambler. The ECC encoder receives a written data from a host terminal and performs an encoding operation of an ECC code on the written data so as to generate an encoded data. The scrambler is coupled between the ECC encoder and the damaged-column manager to perform a data scrambling operation on the encoded data. The writing circuit is coupled to the flash memory, in which the writing circuit writes the encoded data after the disturbance into the flash memory according to the error-column address information. The reading circuit is coupled to the flash memory and reads the read data from the flash memory. The descrambler is coupled to the reading circuit and the ECC decoder to perform a data descrambling operation on the read data and deliver the read data to the ECC decoder.

The flash memory apparatus of the invention includes a flash memory and a memory controller. The memory controller is coupled to the flash memory and includes a damaged-column manager, an ECC decoder and a damaged-column decision circuit. The damaged-column manager logs a damaged-column address information in the flash memory. The ECC decoder receives a read data read by the flash memory, performs decoding on the read data and generates an error information according to the read data. The damaged-column decision circuit is coupled to the ECC decoder and coupled to the damaged-column manager, in which the damaged-column decision circuit receives the error information and updates the damaged-column address information according to the error information.

The method for controlling a flash memory includes: reading a read data from the flash memory; decoding the read data and judging whether or not the read data has error so as to generate an error information; and updating the damaged-column address information according to the error information.

Based on the depiction above, during using the flash memory, the invention is able to dynamically check whether or not the read data read by the flash memory has error and count a number of times for the error-column address to have error. When the number of times for the error-column address to have error is excessive, the error-column address is written into the error-column address information so as to update the damaged-column address information. In this way, the damaged-column address information can be updated instantly to ensure the correctness of accessing the data of the flash memory.

In order to make the features and advantages of the present invention more comprehensible, the present invention is further described in detail in the following with reference to the embodiments and the accompanying drawings.

DESCRIPTION OF THE EMBODIMENTS

Figure 1:
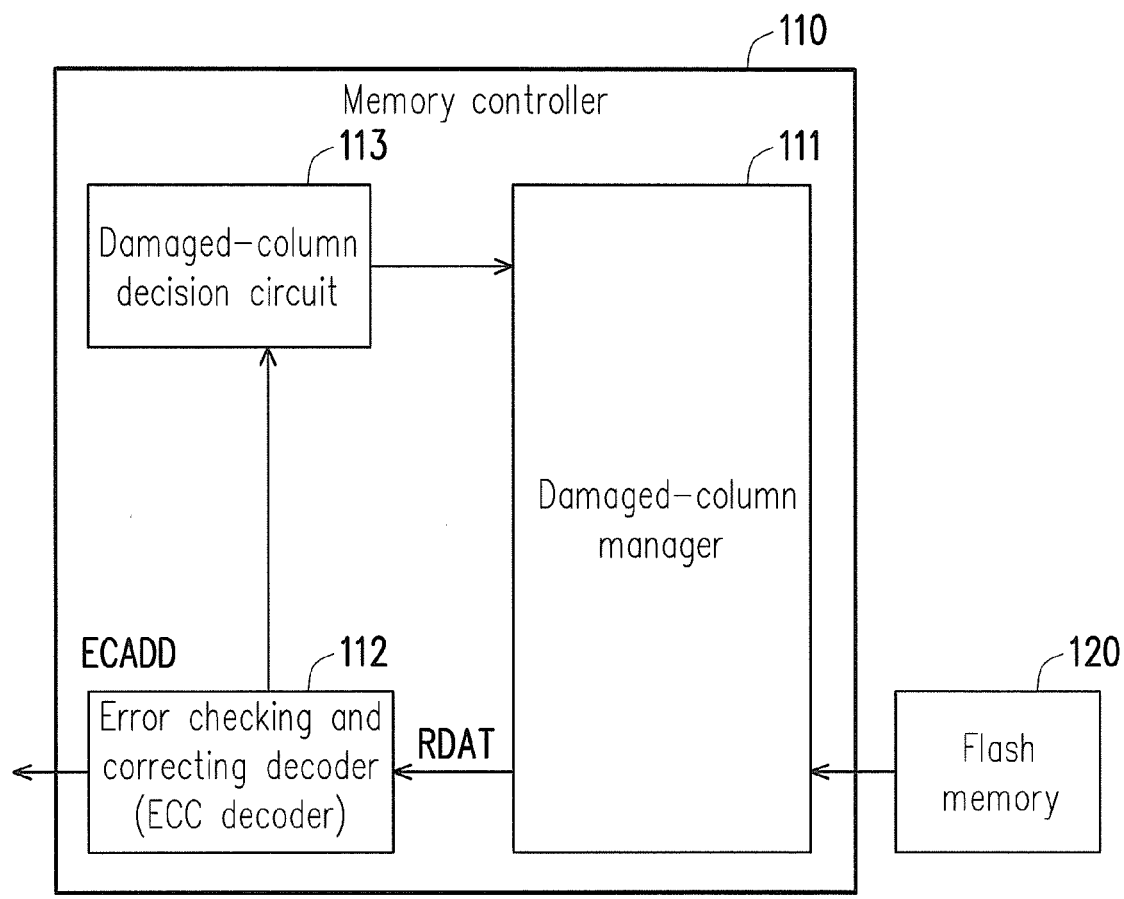
FIG. 1 is a schematic diagram of a flash memory 100 according to an embodiment of the invention.

FIG. 1 is a schematic diagram of a flash memory 100 according to an embodiment of the invention. Referring to FIG. 1, the flash memory apparatus 100 includes a memory controller 110 and a flash memory 120. The memory controller 110 is coupled to the flash memory 120 and configured to control the reading/writing operation of the flash memory 120. The memory controller 110 includes a damaged-column manager 111, an ECC decoder 112 and a damaged-column decision circuit 113. The damaged-column manager 111 has the damaged-column address information of the flash memory 120 stored therein. Specifically, the damaged-column address information includes a plurality of addresses of damaged-columns in the flash memory 120.

The ECC decoder 112 is coupled to the damaged-column decision circuit 113 and the damaged-column manager 111. The ECC decoder 112 receives a read data RDAT read by the flash memory 120, and decodes the read data RDAT so as to perform an error checking and correcting operation (ECC operation). Through the above-mentioned ECC operation, the ECC decoder 112 can be aware of whether or not the read data RDAT has error so as to generate an error information. For example, when the ECC decoder 112 decides the read data RDAT has error by judgement, the ECC decoder 112 can set the column address corresponding to the read data RDAT with error as an error-column address ECADD serving as the error information and output the error-column address ECADD to the damaged-column decision circuit 113.

The damaged-column decision circuit 113 is coupled to the ECC decoder 112 and the damaged-column manager 111. The damaged-column decision circuit 113 can receive the error-column address ECADD provided by the ECC decoder 112, and the damaged-column decision circuit 113 can count a number of accumulated generated times of the error-column address ECADD to obtain the number of accumulated generated times corresponding to the error-column address ECADD. Then, the damaged-column decision circuit 113 delivers the error-column address ECADD to the damaged-column manager 111 according to the number of accumulated generated times. In this way, the damaged-column manager 111 would add the newly-generated error-column address ECADD into the damaged-column address information for updating the damaged-column address information.

In more details, the damaged-column decision circuit 113 can compare the number of accumulated generated times of the error-column address ECADD with a predetermined threshold to decide whether or not providing the error-column address ECADD to the damaged-column manager 111. When the number of accumulated generated times corresponding to the error-column address ECADD is greater than the predetermined threshold, the damaged-column decision circuit 113 confirms the memory cell of the error-column address ECADD has been damaged so as to deliver the error-column address ECADD to the damaged-column manager 111 for the damaged-column manager 111 to update the damaged-column address information. On the contrary, when the number of accumulated generated times corresponding to the error-column address ECADD is not greater than the predetermined threshold, the damaged-column decision circuit 113 temporarily does not deliver the error-column address ECADD to the damaged-column manager 111.

Figure 2:
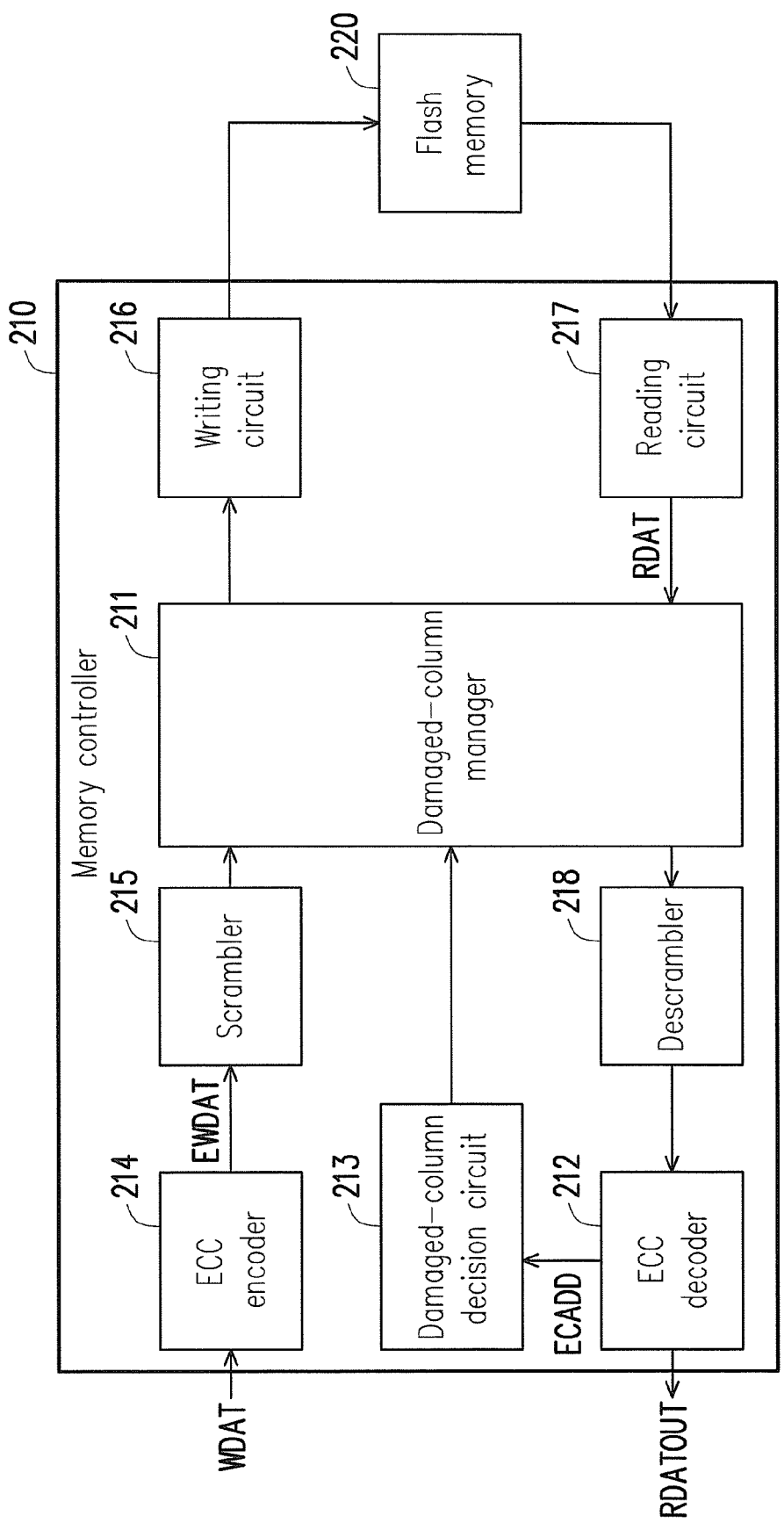
FIG. 2 is a schematic diagram of a memory controller 210 according to an embodiment of the invention.

FIG. 2 is a schematic diagram of a memory controller 210 according to an embodiment of the invention. Referring to FIG. 2, the memory controller 210 is coupled to a flash memory 220 and controls an accessing operation on the flash memory 220. The memory controller 210 includes a damaged-column manager 211, an error checking and correcting decoder 212 (ECC decoder 212), a damaged-column decision circuit 213, an error checking and correcting encoder 214 (ECC encoder 214), a scrambler 215, a writing circuit 216, a reading circuit 217 and an descrambler 218. The ECC encoder 214 receives a written data WDAT from a host terminal, and the ECC encoder 214 performs an encoding operation of the error checking and correcting code (ECC code) on the written data WDAT to generate an encoded data EWDAT. The scrambler 215 is coupled between the ECC encoder 214 and the damaged-column manager 211. The scrambler 215 performs a data scrambling operation on the encoded data EWDAT. The writing circuit 216 is coupled to the flash memory 220. The damaged-column manager 211 provides an undamaged-column address to the writing circuit 216 according to the damaged-column address information, and the writing circuit 216 writes the encoded data EWDAT after the disturbance into the flash memory 220.

The reading circuit 217 is coupled to the flash memory 220 and reads the read data RDAT from the flash memory 220. The descrambler 218 is coupled between the reading circuit 217 and the ECC decoder 212 to perform a data descrambling operation on the read data RDAT and then deliver the ending-disturbed read data RDAT to the ECC decoder 212. The ECC decoder 212 performs decoding and an ECC operation on the ending-disturbed read data RDAT to generate a read and output data RDATOUT.

In addition, when the ECC decoder 212 detects out the read data RDAT is wrong, the ECC decoder 212 sets the column address corresponding to the read data RDAT as an error-column address ECADD and delivers the error-column address ECADD to the damaged-column decision circuit 213. The damaged-column decision circuit 213 decides whether or not delivering the error-column address ECADD to the damaged-column manager 211 according to the number of accumulated generated times corresponding to the error-column address ECADD so that the damaged-column manager 211 performs an updating operation on the damaged-column address information.

Figure 3:
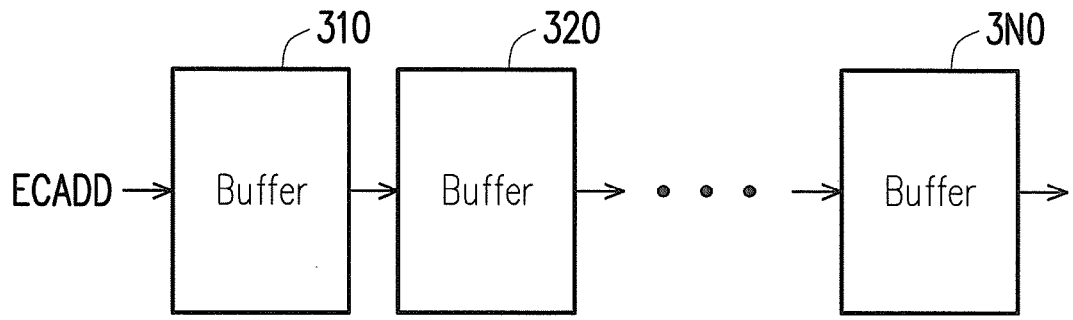
FIG. 3 shows an implementation of a damaged-column decision circuit 213 according to an embodiment of the invention.

The operation detail of the damaged-column decision circuit 213 can be understood referring to FIG. 3, which shows an implementation of a damaged-column decision circuit 213 according to an embodiment of the invention. The damaged-column decision circuit 213 includes a plurality of buffers 310-3N0. The buffers 310-3N0 are coupled in series between an ECC decoder and a damaged-column manager. The first-stage buffer 310 receives the error-column address ECADD sent by the ECC decoder. When it is the first time for the error-column address ECADD to be delivered to the damaged-column decision circuit 213, the error-column address ECADD is registered in the buffer 320. If the error-column address ECADD is delivered to the damaged-column decision circuit 213 once more, the error-column address ECADD is shifted and registered in the buffer 320 and meanwhile, the error-column address ECADD originally stored in the buffer 310 is removed. That is, the i-th-stage buffer is used to store the error-column address ECADD with a number of accumulated generated times equal to i. And analogy for the rest, when the damaged-column decision circuit 213 receives the error-column address ECADD with a number of accumulated generated times equal to N, the error-column address ECADD is sequentially shifted and registered in the buffer 3N0 so that the damaged-column manager updates the damaged-column address information.

In the implementation, the number of the buffers in the damaged-column decision circuit 213 can be decided by the designer, in which the designer sets the number of the buffers according to the number of times for the error events to occur and the probability to have error corresponding to each column address of the flash memory. In short, the chance for the column address to be misjudged as error can be reduced through disposing a plurality of the buffers.

It should be noted that in the implementation, the number of the buffers can be set according to the predetermined threshold in the previous embodiment. In the implementation, the number of the buffers 310-3N0 is N, while the predetermined threshold can be N−1, in which N is a positive integer greater than 1.

Figure 4:
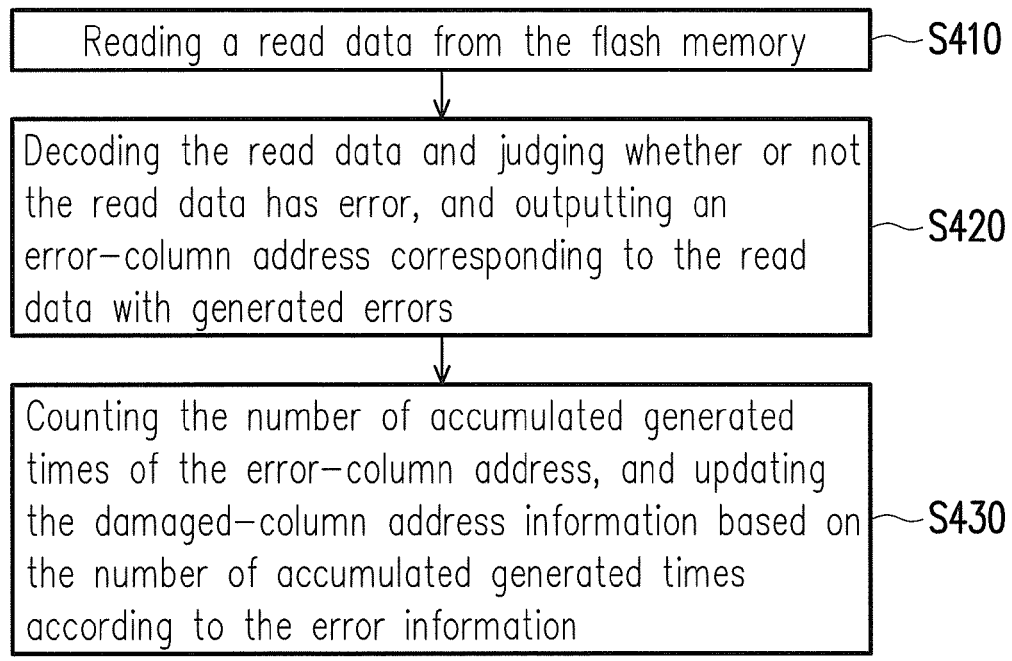
FIG. 4 is a flow chart illustrating a method for controlling a flash memory according to an embodiment of the invention.

FIG. 4 is a flow chart illustrating a method for controlling a flash memory according to an embodiment of the invention. In step S410, the flash memory reads a read data. In step S420, the read data is decoded and it is judged whether or not the read data has error, and if yes, the error-column address corresponding to the read data with error is output. In step S430, the number of accumulated generated times corresponding to the error-column address is counted so as to update the damaged-column address information based on the number of accumulated generated times according to the error-column address.

The detail of the above-mentioned steps can refer to the implementations to get details, which is omitted to describe.

In summary, the invention uses the ECC decoder to detect whether or not the read data has error and deliver the error-column address corresponding to the error-column address with error to the damaged-column decision circuit. By counting a number of accumulated generated times of the error-column address, the damaged-column decision circuit decides whether or not to deliver the error-column address to the damaged-column manager so as to update the damaged-column address information by the damaged-column manager. In this way, during running the flash memory, the damaged-column address information can be updated according to the real state of the flash memory. The damaged-column manager is able to effectively avoid the accessing operation by using the memory cell with the occurred damaged-columns which can maintain the correctness of the data.

What is claimed is:

1. A memory controller, configured to control a flash memory and comprising:
    a damaged-column manager, storing a damaged-column address information in the flash memory;
    an error checking and correcting decoder, receiving a read data read from the flash memory, performing decoding on the read data and generating an error information according to the read data; and
    a damaged-column decision circuit, coupled to the error checking and correcting decoder and coupled to the damaged-column manager, wherein the damaged-column decision circuit receives the error information and updates the damaged-column address information according to the error information,
    wherein, the damaged-column decision circuit adds a newly-generated error-column address into the damaged-column address information to update the damaged-column address information.

2. The memory controller as claimed in claim 1, wherein the error checking and correcting decoder judges whether or not the read data has error and outputs an error-column address corresponding to the read data with generated errors to serve as the error information.

3. The memory controller as claimed in claim 2, wherein the damaged-column decision circuit counts a number of accumulated generated times of the error-column address and delivers the error-column address to the damaged-column manager according to the number of accumulated generated times.

4. The memory controller as claimed in claim 3, wherein the damaged-column manager stores the error-column address so as to update the error-column address information.

5. The memory controller as claimed in claim 3, wherein when the number of accumulated generated times of the error-column address is greater than a predetermined threshold, the damaged-column decision circuit delivers the error-column address to the damaged-column manager.

6. The memory controller as claimed in claim 3, wherein the damaged-column decision circuit comprises:
    a plurality of buffers sequentially coupled in series between the error checking and correcting decoder and the damaged-column manager, wherein an i-th-stage buffer stores the error-column address with a number of accumulated generated times equal to i and i herein is a positive integer.

7. The memory controller as claimed in claim 1, further comprising:
    an error checking and correcting encoder, receiving a written data from a host terminal and performing an encoding operation of an error checking and correcting code on the written data so as to generate an encoded data;
    a scrambler, coupled between the error checking and correcting encoder and the damaged-column manager to perform a data scrambling operation on the encoded data;
    a writing circuit, coupled to the flash memory, wherein the writing circuit writes the encoded data after the disturbance into the flash memory according to the error-column address information;
    a reading circuit, coupled to the flash memory and reading the read data from the flash memory; and
    an descrambler, coupled to the reading circuit and the error checking and correcting decoder to perform a data descrambling operation on the read data and deliver the read data to the error checking and correcting decoder.

8. A flash memory apparatus, comprising:
    a flash memory; and
    a memory controller, coupled to the flash memory and comprising:
        a damaged-column manager, storing a damaged-column address information in the flash memory;
        an error checking and correcting decoder, receiving a read data read by the flash memory, performing decoding on the read data and generating an error information according to the read data; and a damaged-column decision circuit, coupled to the error checking and correcting decoder and coupled to the damaged-column manager, wherein the damaged-column decision circuit receives the error information and updates the damaged-column address information according to the error information, wherein, the damaged-column decision circuit adds a newly-generated error-column address into the damaged-column address information to update the damaged-column address information.

9. The flash memory apparatus as claimed in claim 8, wherein the error checking and correcting decoder judges whether or not the read data has error and outputs an error-column address corresponding to the read data with generated errors to serve as the error information.

10. The flash memory apparatus as claimed in claim 8, wherein the damaged-column decision circuit counts a number of accumulated generated times of the error-column address and delivers the error-column address to the damaged-column manager according to the number of accumulated generated times.

11. The flash memory apparatus as claimed in claim 10, wherein the damaged-column manager stores the error-column address so as to update the damaged-column address information.

12. The flash memory apparatus as claimed in claim 10 wherein when the number of accumulated generated times of the error-column address is greater than a predetermined threshold, the damaged-column decision circuit delivers the error-column address to the damaged-column manager.

13. The flash memory apparatus as claimed in claim 10, wherein the damaged-column decision circuit comprises:

a plurality of buffers sequentially coupled in series between the error checking and correcting decoder and the damaged-column manager, wherein an i-th-stage buffer stores the error-column address with a number of accumulated generated times equal to i and i herein is a positive integer.

14. The flash memory apparatus as claimed in claim 8, wherein the memory controller further comprises:

an error checking and correcting encoder, receiving a written data from a host terminal and performing an encoding operation of an error checking and correcting code on the written data so as to generate an encoded data;

a scrambler, coupled between the error checking and correcting encoder and the damaged-column manager to perform a data scrambling operation on the encoded data;

a writing circuit, coupled to the flash memory, wherein the writing circuit writes the encoded data after the disturbance into the flash memory according to the error-column address information;

a reading circuit, coupled to the flash memory and reading the read data from the flash memory; and an descrambler, coupled to the reading circuit and the error checking and correcting decoder to perform a data descrambling operation on the read data and deliver the read data to the error checking and correcting decoder.

15. A method for updating a damaged-column address information of a flash memory, comprising:

reading a read data from the flash memory;

decoding the read data and judging whether or not the read data has error so as to generate an error information; and updating the damaged-column address information according to the error information by adding a newly-generated error-column address into the damaged-column address information.

16. The method for updating a damaged-column address information of a flash memory as claimed in claim 15, wherein the step of decoding the read data and judging whether or not the read data has error so as to generate an error information comprises:

judging whether or not the read data has error and outputting an error-column address corresponding to the read data with generated errors to serve as the error information.

17. The method for updating a damaged-column address information of a flash memory as claimed in claim 16, wherein the step of updating the damaged-column address information according to the error information comprises:

counting a number of accumulated generated times of the error-column address; and updating the damaged-column address information based on the number of accumulated generated times according to the error information.

18. The method for updating a damaged-column address information of a flash memory as claimed in claim 17, wherein the step of counting the number of accumulated generated times of the error-column address and updating the damaged-column address information based on the number of accumulated generated times according to the error information comprises:

when the number of accumulated generated times of the error-column address is greater than a predetermined threshold, updating the damaged-column address information according to the error-column address.

* * * * *